(12) United States Patent  
Cho et al.

(10) Patent No.: US 9,450,064 B1  
(45) Date of Patent: Sep. 20, 2016

(54) SEMICONDUCTOR ELEMENT, METHOD FOR FABRICATING THE SAME, AND SEMICONDUCTOR DEVICE INCLUDING THE SAME

(71) Applicants: SK hynix Inc., Gyeonggi-do (KR); KOREA ADVANCED INSTUTE OF SCIENCE AND TECHNOLOGY, Daejeon (KR)

(72) Inventors: Byung Jin Cho, Daejeon (KR); Hyun Jun Ahn, Daejeon (KR); Jung Min Moon, Guri-si (KR)

(73) Assignees: SK Hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/828,168

(22) Filed: Aug. 17, 2015

(30) Foreign Application Priority Data

Apr. 8, 2015 (KR) .................. 10-2015-0049375

(51) Int. Cl.
| | |
|---|---|
| *H01L 21/02* | (2006.01) |
| *H01L 29/51* | (2006.01) |
| *H01L 29/06* | (2006.01) |
| *H01L 29/78* | (2006.01) |
| *H01L 29/66* | (2006.01) |
| *H01L 21/28* | (2006.01) |

(52) U.S. Cl.
CPC ....... *H01L 29/512* (2013.01); *H01L 21/02118* (2013.01); *H01L 21/02271* (2013.01); *H01L 21/28158* (2013.01); *H01L 29/0615* (2013.01); *H01L 29/66477* (2013.01); *H01L 29/78* (2013.01)

(58) Field of Classification Search
CPC ............... H01L 29/0615; H01L 29/78; H01L 29/66477; H01L 29/512
USPC .......................................................... 257/406
See application file for complete search history.

(56) References Cited

U.S. PATENT DOCUMENTS 9,012,319 B1 * 4/2015 Choi ................ H01L 21/28158  
438/591

FOREIGN PATENT DOCUMENTS

| KR | 1020110089872 | 8/2011 |
| KR | 1020120088058 | 8/2012 |
| KR | 1020140121634 | 10/2014 |

* cited by examiner

*Primary Examiner* — Douglas Menz  
(74) *Attorney, Agent, or Firm* — I P & T Group LLP

(57) ABSTRACT

A semiconductor element includes: a substrate; a gate dielectric layer formed over the substrate; a flat band voltage adjusting layer formed over the gate dielectric layer; and an intermediate layer formed between the gate dielectric layer and the flat band voltage adjusting layer. A negative flat band voltage generated at the intermediate layer and a positive flat band voltage generated between the substrate and the gate dielectric layer may offset each other.

4 Claims, 5 Drawing Sheets

SEMICONDUCTOR ELEMENT, METHOD FOR FABRICATING THE SAME, AND SEMICONDUCTOR DEVICE INCLUDING THE SAME

CROSS-REFERENCE TO RELATED APPLICATIONS

The present application claims priority of Korean Patent Application No. 10-2015-0049375, filed on Apr. 8, 2015, which is herein incorporated by reference in its entirety.

BACKGROUND

1. Field

Exemplary embodiments relate to a semiconductor device, and more particularly, to an MOS (Metal Oxide Semiconductor)-type semiconductor element, a method for fabricating the same, and a semiconductor device including the same.

2. Description of the Related Art

In a MOS field effect transistor, the number of nodes in a semiconductor element has decreased due to continuous down-scaling of the semiconductor element. Thus, when a gate is deposited during an RMC (replacement metal gate) process, a gate thin film needs to be uniformly deposited in a region having a high aspect ratio. However, an existing CVD (Chemical Vapor Deposition) or PVD (Physical Vapor Deposition) method has a limitation in depositing a uniform thin film at a sub-20 nm-size node. To solve such a problem, a new technology has been developed, which is capable of uniformly depositing various gate-electrode metals in a region having a high aspect ratio through an Atomic Layer Chemical Vapor Deposition (ALCVD) method.

Korean Patent Laid-open Publication No. 2011-0089872 discloses a technology for forming a gate electrode in a semiconductor device, but does not propose a method capable of solving the above-described problem.

SUMMARY

Exemplary embodiments are directed to a semiconductor element having a stable and uniform gate layer deposited in a region having a high aspect ratio, a method for fabricating the same, and a semiconductor device including the same.

In an embodiment, a semiconductor element includes: a substrate; a gate dielectric layer formed over the substrate; a flat band voltage adjusting layer formed over the gate dielectric layer; and an intermediate layer formed between the gate dielectric layer and the flat band voltage adjusting layer. A negative flat band voltage generated at the intermediate layer and a positive flat band voltage generated between the substrate and the gate dielectric layer may offset each other.

In another embodiment, a semiconductor element includes: a substrate; a gate dielectric layer formed over the substrate, and having a concave portion formed in a part thereof; a flat band voltage adjusting layer formed outside the gate dielectric layer positioned at the concave portion; an intermediate layer formed between the gate dielectric layer and the flat band voltage adjusting layer; and a metal layer formed outside the flat band voltage adjusting layer so as to fill the concave portion. A negative flat band voltage generated at the intermediate layer and a positive flat band voltage generated between the substrate and the gate dielectric layer may offset each other.

In an embodiment, a method for fabricating a semiconductor element includes: forming a gate electric layer over a substrate; and sequentially forming an intermediate layer and a flat band voltage adjusting layer over the gate dielectric layer. The flat band voltage adjusting layer may be formed of a material having a negative flat band voltage shifting characteristic.

In an embodiment, a method for fabricating a semiconductor element includes: forming a gate dielectric layer over a substrate; forming a concave portion iii a part of the gate dielectric layer; sequentially forming an intermediate layer and a flat band voltage adjusting layer outside the gate dielectric layer positioned at the concave portion; and forming a metal layer to fill the concave portion formed outside the flat band voltage adjusting layer. The flat band voltage adjusting layer may be formed of a material having a negative flat band voltage shifting characteristic.

DETAILED DESCRIPTION

Exemplary embodiments will be described below in more detail with reference to the accompanying drawings. The disclosure may, however, be embodied in different forms and should not be construed as limited to the embodiments set forth herein.

Moreover, detailed descriptions related to well-known functions or configurations will be omitted for conciseness.

Although the terms first and second are used herein to describe various elements, these elements should not be limited by these terms, and are used only for distinguishing one element from another element.

Figure 1:
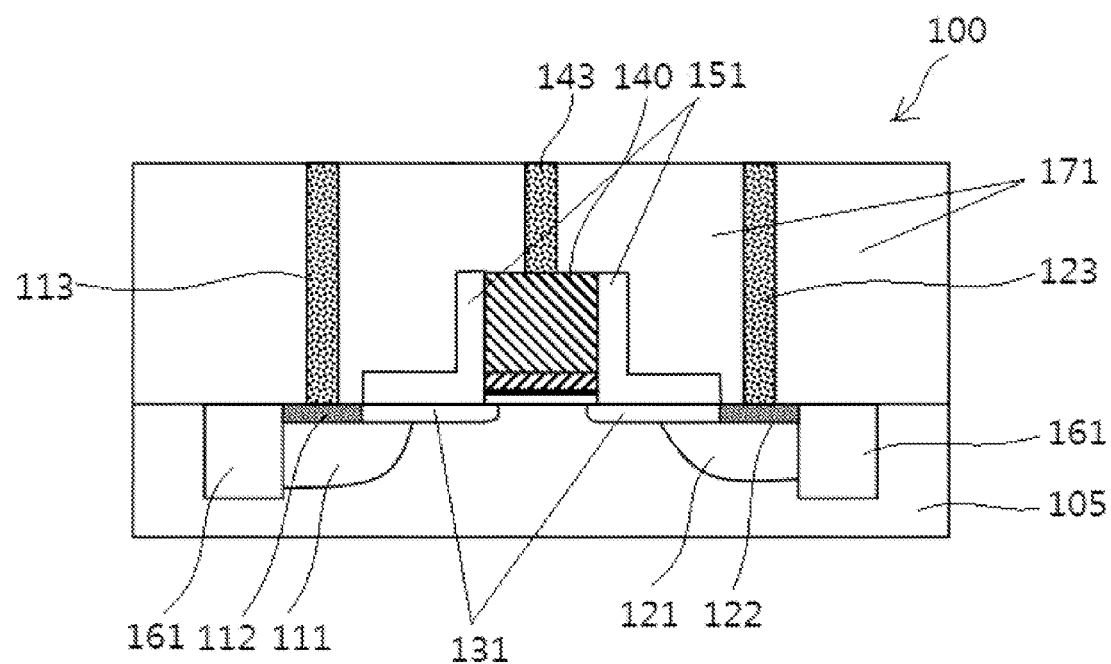
FIG. 1 is a cross-sectional view of a semiconductor device in which a semiconductor element in accordance with an embodiment is formed.

FIG. 1 is a cross-sectional view of a semiconductor device 100 having a semiconductor element in accordance with an embodiment. Referring to FIG. 1, the semiconductor device 100 includes a substrate 105, a semiconductor element 111 to 151, element isolation layers 161, and an interlayer dielectric layer 171.

The substrate 105 is formed of a semiconductor, for example, a high-concentration N-type (N+) semiconductor. The substrate 105 may be formed of an arbitrary material which can function as a base in which the semiconductor element 111 to 151 is formed, for example, silicon or germanium. The substrate 105 is formed in a plate shape. The substrate 105 may include a low-concentration N-type (N−) epitaxial layer (not illustrated) formed therein in order to prevent electrons or holes generated in the semiconductor element 111 to 151 from moving to the bottom of the substrate 105.

The element isolation layers 161 surround the semiconductor element 111 to 151. That is, the element isolation layers 161 are formed adjacent to a source region 111 and a drain region 121. The element isolation layers 161 electrically isolate adjacent semiconductor elements from each other. The element isolation layer 161 is formed between adjacent semiconductor elements in the substrate 105.

The element isolation layers 161 may be formed as wells to which P-type impurities are injected. The element isolation layers 161 can reduce a leakage current and secure a break-down voltage. The element isolation layers 161 have a function of electrically isolating the semiconductor element 111 to 151 from the surroundings.

The interlayer dielectric layer 171 is formed over the substrate 105. The interlayer dielectric layer 171 electrically insulates layers from each other which are arranged in a vertical direction and electrically insulates elements, for example, semiconductor elements from each other in a horizontal view.

The semiconductor element 111 to 151 includes channels 131, a source region 111, a source electrode 113, a drain region 121, a drain electrode 123, a gate layer 140, and a gate electrode 143.

The channels 131 are formed between the source region 111 and the drain region 121. The channels 131 have the same conductivity type as the source region 111 and the drain region 121. For example, when the source region 111 and the drain region 121 have N-type impurities, the channels 131 also have the N-type impurities, and when the source region 111 and the drain region 121 have P-type impurities, the channels 131 also have the P-type impurities. The channels 131 form current paths of the semiconductor element 111 to 151, that is, transfer paths of electrons or holes from the source region 111 to the drain region 121 or from the drain region 121 to the source region 111.

As N-type or P-type impurities are injected into the source region 111 and the drain region 121, the source region 111 and the drain region 121 serve as the source and drain of the semiconductor element 111 to 151, respectively. At this time, the impurities which are injected into the source region 111 and the drain region 121 are the same as each other.

The source region 111 is coupled to the source electrode 113 and electrically coupled to an external device through the source electrode 113.

The drain region 121 is coupled to the drain electrode 123 and electrically coupled to an external device through the drain electrode 123.

The source electrode 113 and the drain electrode 123 are coupled to the source region 111 and the drain region 121 through a source junction 112 and a drain junction 122 respectively.

The gate layer 140 is formed over the substrate 105 so as to cover the region between the channels 131. The gate layer 140 will be described in more detail with reference to FIG. 2.

On a side surface of the gate layer 140, a side wall 151 is formed. The side wall 151 protects the gate layer 140. For example, the side wall 151 prevents electric charges from flowing into or flowing out from the gate layer 140 through the interlayer dielectric layer 171. The side wall 151 fixes the gate layer 140 at a predetermined position.

The gate electrode 143 is coupled to the gate layer 140, and the gate layer 140 is electrically coupled to an external device through the gate electrode 143.

The source electrode 113, the drain electrode 123, and the gate electrode 143 are formed of a conductive metal such as aluminum.

Figure 2:
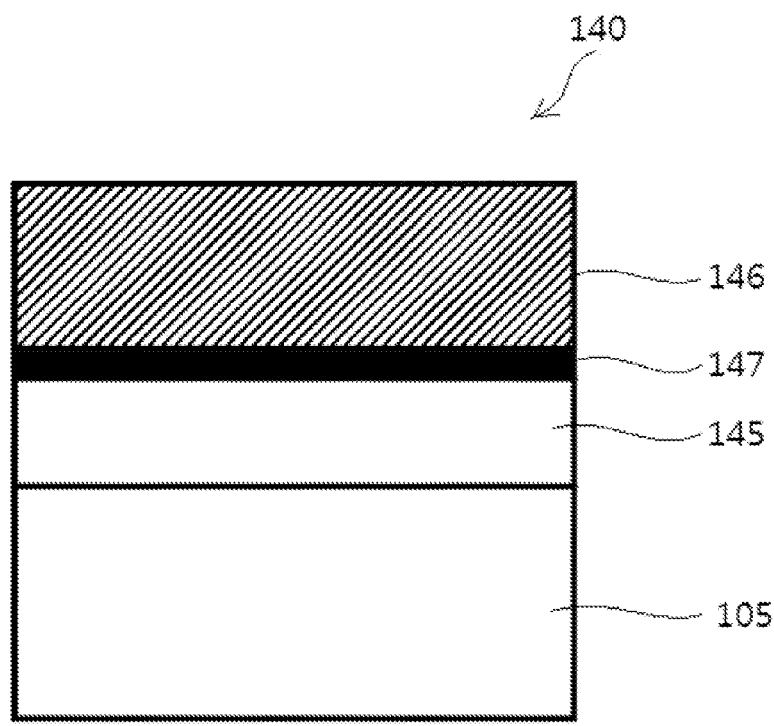
FIG. 2 is an expanded cross-sectional view of a gate layer formed over a substrate illustrated in FIG. 1.

FIG. 2 is an expanded cross-sectional view of the gate layer 140 formed over the substrate 105 illustrated in FIG. 1. Referring to FIG. 2, the gate layer 140 includes a gate dielectric layer 145, an intermediate layer 147, and a flat band voltage adjusting layer 146.

The gate dielectric layer 145 is formed over the substrate 105. The gate dielectric layer 145 may be formed of an oxide. The oxide may include an oxide having a high dielectric constant (high-k). The high-k oxide includes hafnium oxide hafnium silicon oxide, lanthanum oxide, lanthanum aluminum oxide zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, lead zinc niobate, or the like. However, the gate dielectric layer 145 is not limited to the high dielectric constant (high-k) material and may be formed of another material capable of reducing a gate leakage current.

The intermediate layer 147 is formed over the gate dielectric layer 145, and the flat band voltage adjusting layer 145 is formed over the intermediate layer 147. The flat band voltage adjusting layer 146 is formed of lanthanide series-based material, for example, erbium carbide. Thus, the flat band voltage adjusting layer 146 has a low work function, for example, a work function of 3.9 [eV] to 43 [eV]. That is, the flat band voltage adjusting layer 146 formed of erbium carbide may have a low work function even over the high-k gate dielectric layer 145. The flat band voltage adjusting layer 146 has a thickness enough to have a low work function suitable for a gate electrode of an NMOS transistor.

The intermediate layer 147 is formed by the same process as that forming the flat band voltage adjusting layer 146. Thus, the intermediate layer 147 is also formed of lanthanide-based oxide. Since the intermediate layer 147 is formed of lanthanide-based oxide, the intermediate layer 147 has a negative flat band voltage shifting characteristic.

As the flat band voltage adjusting layer 146 having a low work function is formed over the high-k gate dielectric layer 145, the intermediate layer 147 between the gate dielectric layer 145 and the flat band voltage adjusting layer 146 has a negative flat band voltage shifting characteristic. Due to a dipole between the substrate 105 and the high-k gate dielectric layer 145, a dual-band voltage is generated between the substrate 105 and the gate dielectric layer 145. Therefore, the negative flat band voltage and the dual band voltage offset each other to lower the work function of the negative flat band voltage adjusting layer 146. As a result, the semiconductor element 111 to 115 stably operates.

Figure 3:
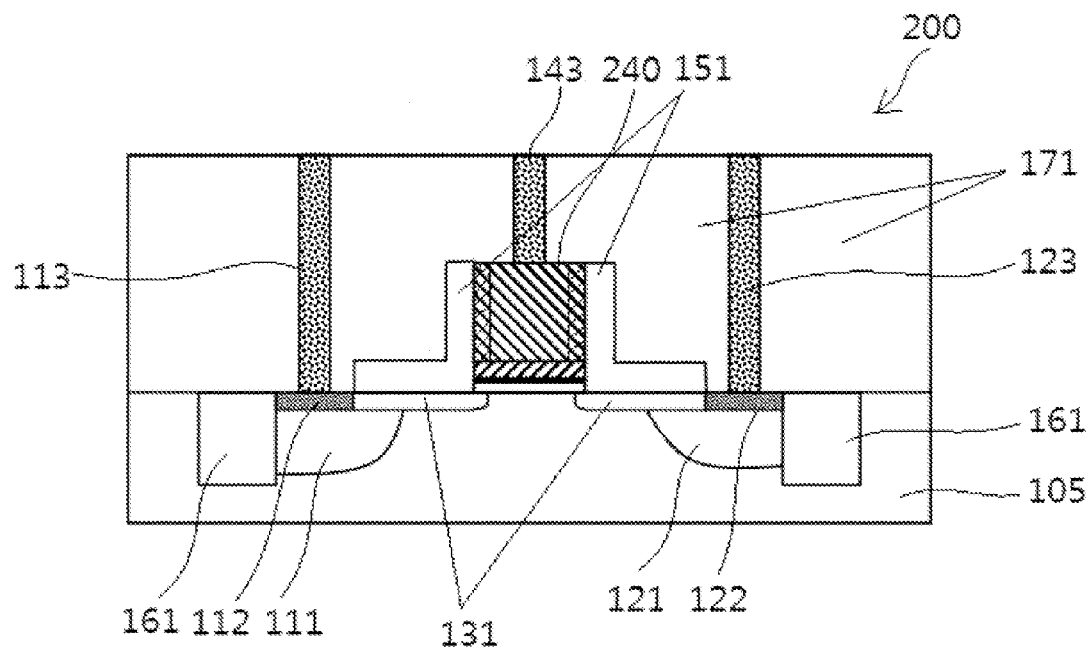
FIG. 3 is a cross-sectional view of a semiconductor device in which semiconductor elements in accordance with another embodiment are formed.
Figure 4:
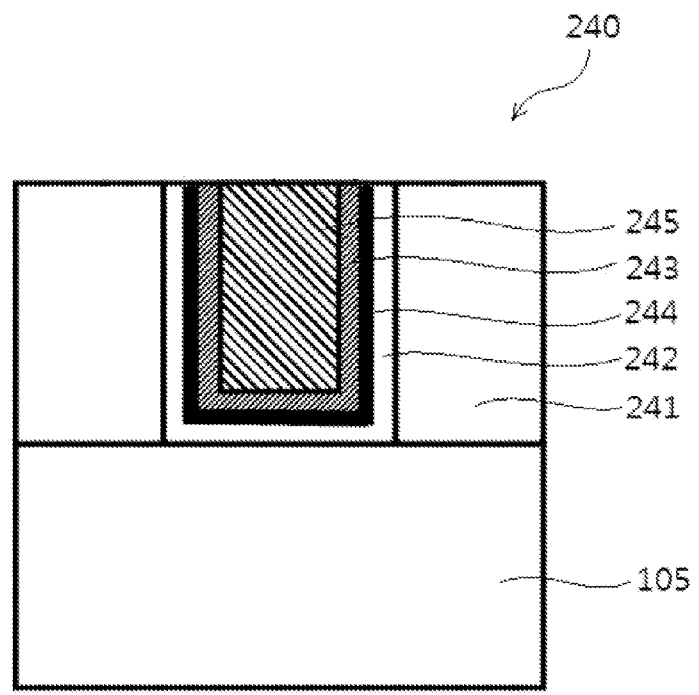
FIG. 4 is an expanded cross-sectional view of a gate layer formed over a substrate illustrated in FIG. 3.

FIG. 3 is a cross-sectional view of a semiconductor device 200 in which semiconductor element 111 to 151 in accordance with another embodiment is formed, and FIG. 4 is an expanded cross-sectional view of a gate layer 240 formed over the substrate 105 illustrated in FIG. 3.

In the semiconductor device 200 illustrated in FIGS. 3 and 4, the same components as those of the semiconductor device 100 illustrated in FIGS. 1 and 2 are represented by like reference numerals, and the duplicated descriptions thereof are omitted herein.

Referring to FIG. 4, the gate layer 240 includes a first gate dielectric layer 241, a second gate dielectric layer 242, an intermediate layer 244, a flat band voltage adjusting layer 243, and a metal layer 245.

The first gate dielectric layer 241 is formed over the substrate 105, and the second gate dielectric layer 242 is formed in the first gate dielectric layer 241. The first and second gate dielectric layers 241 and 242 may be formed of oxide. The first and second gate dielectric layers 241 and 242 may be formed of a high-k oxide. The high-k oxide includes hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, lead zinc niobate, or the like. In the present embodiment, although the high-k materials are taken as examples for the material of the first and second gate dielectric layers 241 and 242, the first and second gate dielectric layers 241 and 242 may be formed of another material capable of reducing a gate leakage current. The first and second gate dielectric layers 241 and 242 may be combined together to ford a single insulating layer.

The intermediate layer 244 is formed in the second gate dielectric layer 242, and the flat band voltage adjusting layer 243 is formed in the intermediate layer 244. The flat band voltage adjusting layer 243 is formed of lanthanide series-based material, for example, erbium carbide. Thus, the flat band voltage adjusting layer 243 has a low work function, for example, a work function of 3.9 eV to 4.3 eV. That is the flat band voltage adjusting layer 243 formed of erbium carbide may have a low work function even over the high-k gate dielectric layer 242. The flat band voltage adjusting layer 243 has a thickness enough to have a low work function suitable for a gate electrode of an NMOS transistor.

The intermediate layer 244 is formed by the same process as that forming the flat band voltage adjusting layer 243. Thus, the intermediate layer 244 is also formed of lanthanide-based oxide. Since the intermediate layer 244 is formed of lanthanide-based oxide, the intermediate layer 147 has a negative flat band voltage shifting characteristic.

The metal layer 245 is formed in the flat band voltage adjusting layer 243. The metal layer 245 is formed of a conductive metal having a low resistance, for example, titanium nit de, tungsten, titanium, aluminum, tantalum, tantalum nitride, cobalt, copper, or nickel.

As the flat band voltage adjusting layer 243 having a low work function is formed in the high-k second gate dielectric layer 242, the intermediate layer 244 between the second gate dielectric layer 242 and the flat band voltage adjusting layer 243 has a negative flat band voltage shifting characteristic. Due to a dipole between the substrate 105 and the high-k second gate dielectric layer 242, a dual-band voltage is generated between the substrate 105 and the second gate dielectric layer 242. Therefore, the negative flat band voltage and the dual band voltage offset each other so as to lower the work function of the flat band voltage adjusting layer 243. As a result, the semiconductor element stably operates.

Figure 5:
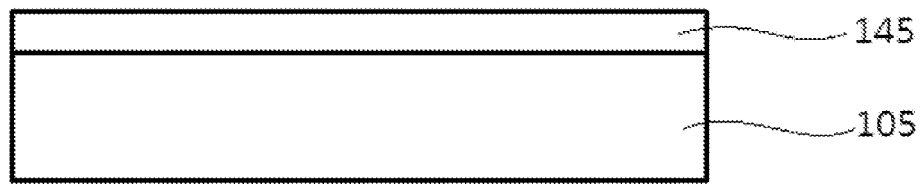
FIGS. 5 and 6 are cross-sectional views of the semiconductor device, sequentially illustrating a method for fabricating the gate layer of FIG. 2.
Figure 6:
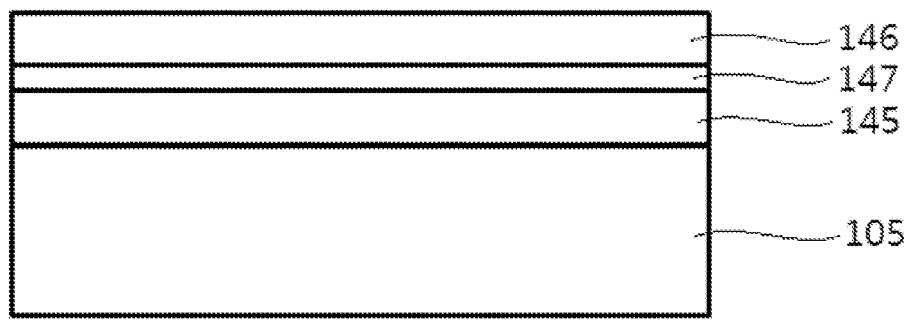

FIGS. 5 and 6 are cross-sectional views of the semiconductor device 100, sequentially illustrating a method for fabricating the gate layer 140 of FIG. 2.

Referring to FIG. 5, the gate dielectric layer 145 is formed over the substrate 105. The gate dielectric layer 145 may be formed of a high-k oxide. The gate dielectric layer 145 may be formed over the substrate 105 through the ALCVD method. To form the gate dielectric layer 145, a metal oxide precursor, for example, metal chloride and steam are alternately supplied at a predetermined flow rate to a CVD reactor which operates at a predetermined pressure while the substrate 105 is maintained at a predetermined temperature. The CVD reactor may operate for a sufficiently long time to form the gate dielectric layer 145 to a predetermined thickness.

As such, the gate dielectric layer 145 may be stably and uniformly deposited through the ALCVD method.

Referring to FIG. 6, the flat band voltage adjusting layer 146 is formed over the gate dielectric layer 145. The flat band voltage adjusting layer 146 may be formed by depositing lanthanide series-based material, for example, erbium carbide on the gate dielectric layer 145. The method for depositing erbium carbide is performed as follows.

The substrate 105 is mounted in a chamber (not illustrated), and a precursor containing erbium and a precursor containing carbon are alternately provided into the CVD reactor for a predetermined pulse time. In another embodiment, a precursor including erbium and carbon is used to perform a deposition process through the CVD reactor while the chamber is maintained at a predetermined temperature. The operation time of the CVD reactor and the pulse time of the precursor containing carbon and the precursor containing erbium (lanthanum group) may vary depending on a desired work function, a desired thickness, or a composition ratio of the flat band voltage adjusting layer 146 which is formed over the substrate 105. The exposure time of the erbium containing precursor and the carbon containing precursor and the operation time of the CVD reactor are set to such values that the erbium carbide has a desired thickness and work function.

The carbon containing precursor may include trimethylaluminum, trimethylboron, or a combination thereof. The erbium containing precursor may include erbium halide, for example, erbium tetrachloride. Furthermore, the precursor containing both an erbium source and a carbon source may include a cyclopentadienyl-based precursor such as tris-(isopropyl-cyclopentadienyl) erbium, tris-(butylcyclopentadienyl) erbium tris-(cyclopentadienyl) erbium, or the like.

The exposure time of the substrate 105 including the gate dielectric layer 145 to the precursor varies depending on a vapor pressure and a temperature in the reactor or at a surface of the substrate 105 including the gate dielectric layer 145. The substrate 105 including the gate dielectric layer 145 needs to be exposed to the precursor for a sufficient time period so that the precursor can react with the surface of the substrate 105 including the gate dielectric layer 145. The temperature of the substrate 105 may be maintained between approximately 200° C. and 600° C. The optimal temperature of the substrate 105 may vary depending on what kind of precursor is used and/or a pulse time of the precursor containing erbium or carbon.

In an embodiment, deposition is performed within a steady process temperature, for example, at a temperature equal to or higher than thermal energy at which the precursor is condensed or deposited on the surface of the substrate 105 or at a temperature at which the precursor is decomposed or desorbed on the surface of the substrate 105. The substrate 105 may be deposited at a relatively lower temperature by using a plasma-CVD method which utilizes plasma energy for deposition, compared with a non-plasma CVD method.

To deposit erbium carbide having a lower work function using a tris-(isopropylcyclopentadienyl) erbium precursor, the precursor is injected into the CVD reactor during a sufficient time period in which a uniform thin film can be deposited in a state in which the precursor is sufficiently heated to deposit on the substrate and form the thin film. The precursor may include, for example, tris-(isopropylcyclopentadienyl) erbium which contains both an erbium source and a carbon source.

The flat band voltage adjusting layer 146 requires enough thickness to have a work function suitable for an NMOS gate electrode. At this time, a minimum number of deposition cycles for depositing the flat band voltage adjusting layer 146 having a sufficient thickness, are performed. Each cycle includes injecting tris (isopropyl-cyclopentadienyl) erbium, removing by-products using inert gas, performing a plasma treatment, and removing by-products using inert gas.

After the precursor or reactant is injected into the chamber, the CVD reactor is emptied by purging by-products during a time in which the by-products can be sufficiently purged to obtain a stable thin film by purging the by-products formed before the precursor or reactant is injected.

The intermediate layer 147 is formed between the gate dielectric layer 145 and the flat band voltage adjusting layer 146 by a process in which erbium carbide is deposited over the gate dielectric layer 145.

However, when the intermediate layer 147 is not formed even after the flat band voltage adjusting layer 146 is formed, a heat treatment may be performed to form the intermediate layer 147.

FIGS. 7 to 10 are cross-sectional views of the semiconductor device, sequentially illustrating a method for fabricating the gate layer of FIG. 4.

Figure 7:
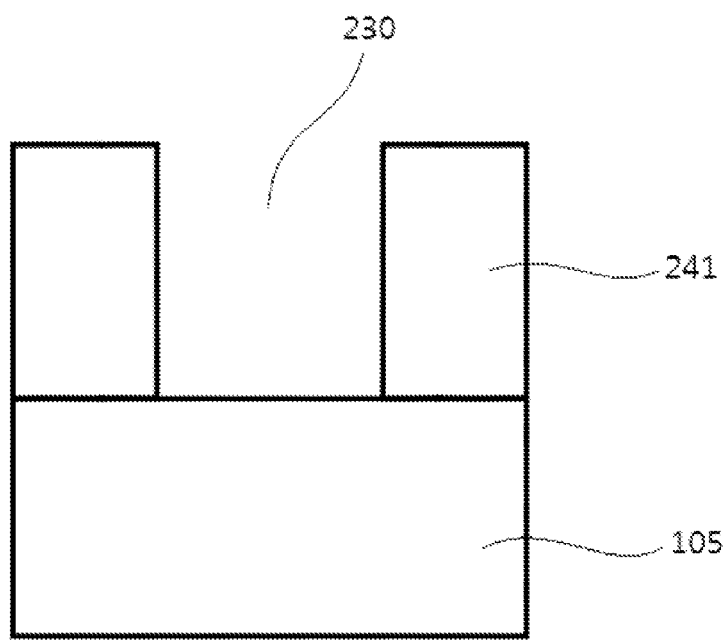
FIGS. 7 to 10 are cross-sectional views of the semiconductor device, sequentially illustrating a method for fabricating the gate layer of FIG. 4.

Referring to FIG. 7, an insulating layer is formed over the substrate 105, and then patterned and etched to form a concave portion 230. Thus, as illustrated in FIG. 7, a first gate dielectric layer 241 having the concave portion 230 formed in the center thereof is formed. Specifically, a photoresist film (not illustrated) is formed over an insulating layer, and then patterned.

The patterning process is performed by forming a specific pattern, for example, a mask over the photoresist film and sequentially performing an exposure process and a development process using the mask (not illustrated). Then, the insulating layer is etched according to the specific pattern, and the photoresist layer is removed. As a result, the concave portion 230 is formed as illustrated in FIG. 8.

Figure 8:
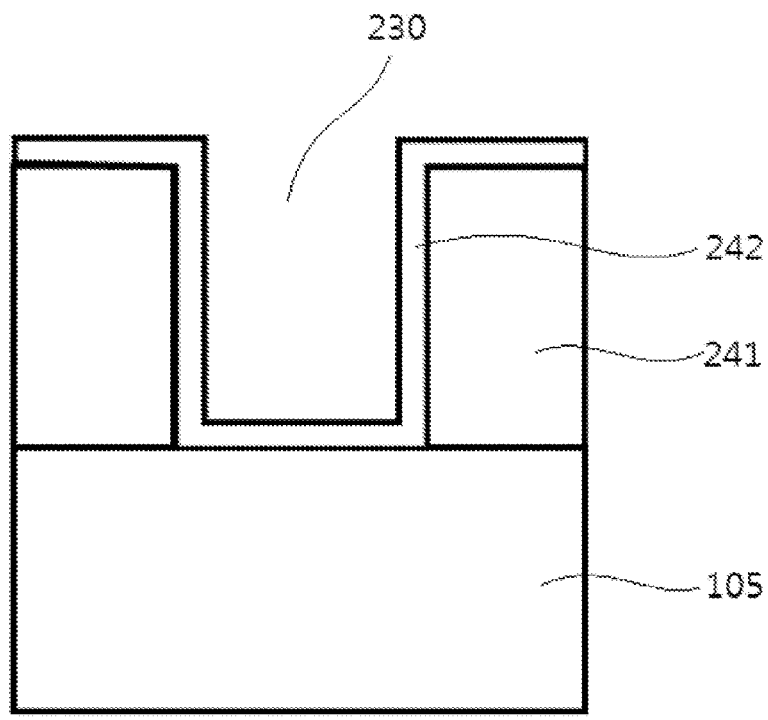

Referring to FIG. 8, a second gate dielectric layer 242 is formed over the first gate dielectric layer 241.

Figure 9:
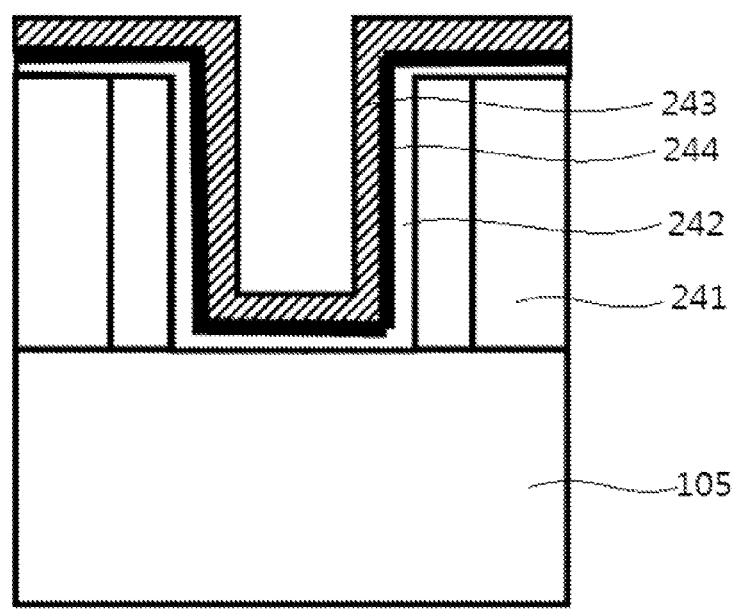

Referring to FIG. 9, a flat band voltage adjusting layer 243 is formed over the second gate dielectric layer 242. The flat band voltage adjusting layer 243 may be formed by depositing erbium carbide over the second gate dielectric layer 242. The method for depositing erbium carbide is performed as follows.

The substrate 105 is mounted in a chamber (not illustrated), and a precursor containing erbium and a precursor containing carbon are alternately injected into the CVD reactor during a predetermined pulse time period. In another embodiment, a precursor including both erbium and carbon is injected as a source gas to the CVD reactor to perform a deposition process. The chamber is maintained at a predetermined temperature while the deposition process is performed. The operation time of the CVD reactor and the pulse time of the precursor containing carbon and the precursor containing erbium may vary depending on a desired work function, a desired thickness, and a composition ratio of layers, for example, the first and the second gate dielectric layers 241, 242, which are formed over the substrate 105. The exposure time of the erbium-containing precursor and the carbon-containing precursor and the operation time of the CVD reactor are set so that the erbium carbide layer has a desired thickness and a work function.

The carbon-containing precursor may include a precursor containing trimethylaluminum or trimethylboron or a combination thereof. The erbium-containing precursor may include erbium halide, for example, erbium tetrachloride. Furthermore, the precursor containing both erbium and carbon may include a cyclopentadienyl-based precursor such as tris-(isopropyl-cyclopentadienyl) erbium, tris-(butylcyclopentadienyl) erbium and tris-(cyclopentadienyl) erbium. The exposure time of the precursor may vary depending on a vapor pressure and a temperature in the CVD reactor. The precursor needs to be injected during a sufficient time so that the precursor can react with the surface of the substrate.

The temperature of the substrate 105 needs to be maintained between approximately 200° C. and 600° C. The optimal temperature of the substrate 105 may vary depending on the type of the precursor.

In an embodiment, deposition is performed within a uniform process temperature, for example, at a temperature equal to or higher than thermal energy at which the precursor is condensed or deposited on the surface of the substrate 105 or at a temperature at which the precursor is decomposed or desorbed on the surface of the substrate 105. The substrate 105 may be deposited at a relatively lower temperature using plasma CVD which utilizes plasma energy generated within the CVD reactor.

To deposit erbium carbide having a lower work function using tris-(isopropylcyclopentadienyl) erbium precursor, the precursor is injected into the CVD reactor during a sufficient time period so that a uniform thin film can be deposited. The precursor is sufficiently heated and has enough vapor pressure to deposit on the substrate and form a thin film. The temperature condition may vary in consideration of the vapor pressure of the precursor. For example, when tris-(isopropylcyclopentadienyl) erbium, containing both erbium and carbon is used, the temperature condition may be set differently from the case in which the erbium source gas and the carbon source gas are separately injected into the CVD reactor.

The flat band voltage adjusting layer 146 needs to have a thickness at which an NMOS gate electrode may have a suitable work function. At this time, a minimum number of deposition cycles for depositing the flat band voltage adjusting layer 146 having a sufficient thickness are performed. Each cycle includes injecting tris (isopropyl-cyclopentadienyl) erbium, removing by-products using inert gas, performing a plasma treatment and removing by-products using inert gas.

After the precursor or reactant is injected into the chamber, the CVD reactor is emptied by purging by-products to obtain a uniform thin film by purging the by-products formed prior to a next injection process.

The intermediate layer 244 is formed between the second gate dielectric layer 242 and the flat band voltage adjusting layer 243 by a process in which the erbium carbide is deposited on the second gate dielectric layer 242. However, when the intermediate layer 244 is not formed even after the flat band voltage adjusting layer 243 is formed, a heat treatment is performed to form the intermediate layer 244.

Figure 10:
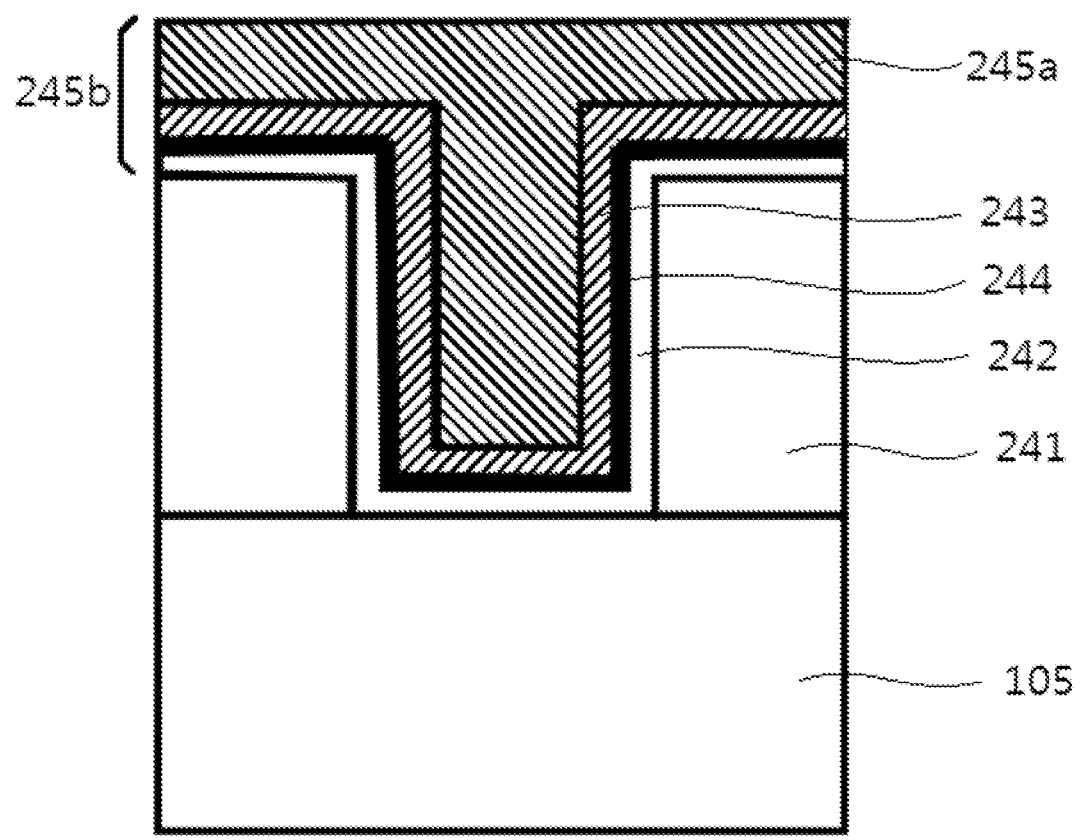

Referring to FIG. 10, a metal layer 245a is formed on the flat band voltage adjusting layer 243. At this time, the metal layer 245a is formed to completely fill the concave portion 230. The metal layer 245a may be formed of a metal having a low resistance, for example, titanium nitride, tungsten, titanium, aluminum, tantalum, tantalum nitride, cobalt, copper, or nickel.

Then, an upper portion 245b of the metal layer 245a which is located at a higher level than an upper surface of the first gate dielectric layer 241a is removed to form the gate layer 240 as illustrated in FIG. 4.

According to the embodiments, the flat band voltage adjusting layer having a low work function is formed evenly over the high-k gate dielectric layer in the semiconductor element using the characteristic of lanthanide-containing material, for example, lanthanide carbide. Furthermore, lanthanide carbide may be stably and uniformly deposited in a region having a high aspect ratio through the ALCVD method. Therefore, the semiconductor element and the semiconductor device including the same stably operate.

What is claimed is:

1. A semiconductor element comprising:
    a substrate;
    a gate dielectric layer formed over the substrate;
    a flat band voltage adjusting layer formed over the gate dielectric layer, and comprised of a lanthanide series-based material; and
    an intermediate layer formed between the gate dielectric layer and the flat band voltage adjusting layer, and comprised of lanthanide-based oxide;
    wherein a positive flat band voltage generated between the substrate and the gate dielectric layer is offset by a negative flat band voltage generated at the intermediate layer between the gate dielectric layer and the flat band voltage adjusting layer.

2. The semiconductor element of claim 1, wherein the gate dielectric layer includes oxide.

3. The semiconductor element of claim 1, wherein the flat band voltage adjusting layer includes erbium carbide.

4. A semiconductor device comprising the semiconductor element of claim 1.

* * * * *